United States Patent [19]

Asada

[11] Patent Number: 5,751,591

[45] Date of Patent: May 12, 1998

[54] THREE DIMENSIONAL WIRING INDUCTANCE CALCULATION SYSTEM

[75] Inventor: Susumu Asada, Tokyo, Japan

[73] Assignee: NEC Corporation, Tokyo, Japan

[21] Appl. No.: 555,804

[22] Filed: Nov. 9, 1995

[30] Foreign Application Priority Data

Nov. 9, 1994 [JP] Japan ................................ 6-274829

[51] Int. Cl.$^6$ ............................................. G06F 17/50
[52] U.S. Cl. ..................... 364/488; 364/468.04; 364/578
[58] Field of Search .................................. 364/488, 489, 364/490, 491, 578, 468.04

[56] References Cited

U.S. PATENT DOCUMENTS

| 4,933,889 | 6/1990 | Meshkat et al. | 364/578 |
| 5,103,415 | 4/1992 | Omura et al. | 364/578 |

OTHER PUBLICATIONS

Hoer et al., "Exact Inductance Equations for Rectangular Conductors With Applications to More Complicated Geometries", Journal of Research of the National Bureau of Standards, vol. 69C, No. 2, (1965) pp. 127–137.

Brennan et al., "Three–Dimensional Inductance Computations with Partial Element Equivalent Circuits", IBM J. Res. Develop, vol. 23, No. 6, (1979), pp. 661–668.

Nabors, et al., "Fast Capacitance Extraction of General Three–Dimensional Structures", IEEE Transactions on Microwave Theory and Techniques, vol. 40, No. 7, (1992) pp. 1496–1506.

Morweiser et al., "CAD of Passive Multilayer Components Using Electromagnetic Field Computations," IEEE Trans. on Comp., Pkg., and Mfg. Tech., vol. 17, No. 3, Sep. '94, pp. 338–343.

Rozenblit et al., "CAD System for VLSI Interconnections," ICCD '89, pp. 237–241.

Ueyama et al., "3–D Analyses of Electromagnetic Field Including Conductors Connected with Voltage Sources," IEEE Trans. on Magnetics, vol. 29, No. 2, Mar. 1993, pp. 1385–1388.

Brauer et al., "A Symptotic Boundary Condition for 3–D Magnetostatic Finite Elements," IEEE Trans. on Magnetics, vol. 27, No. 6, Nov. 1991, pp. 5013–5015.

Hosoya et al., "Inductance Calculation System for Superconducting Circuits," IEEE Trans. on Magnetics, vol. 25, No. 2, Mar. 1989, pp. 1111–1114.

Kamon et al., "FASTHENRY", IEEE Trans. on Microwave Theory and Techniques, vol. 42, No. 9, Sep. 1994, pp. 1750–1758.

Kim et al., "A Vector Surface Integral Approach to Computing Inductances of General 3–D Structures," 1993 IEEE MTT–S Digest, pp. 1535–1538.

Primary Examiner—Jacques H. Louis-Jacques
Assistant Examiner—Leigh Marie Garbowski
Attorney, Agent, or Firm—Foley & Lardner

[57] ABSTRACT

A three dimensional wiring inductance calculating system taking the wiring as analyzing space expressed as three-dimensional configuration and make discrete the analyzing space into a finite number of partial elements. By solving a Poisson's equation with respect to an electrical potential in the discrete analyzing space, a current value and a current density vector distribution within the wiring are derived. Also, by solving an integral equation of a vector potential including the current density vector at each of points of partial elements within the wiring by making discrete, the vector potential as a boundary condition at a boundary of the wiring is derived. Then, the vector potential is derived by solving a vector potential equation in the discretized analyzing space with taking the vector potential value at the boundary as the boundary condition. A product of the obtained vector potential and the current density vector per unit current value is normalized for deriving an integral sum of the produce within the analyzing space and calculating an inductance of the wiring.

18 Claims, 5 Drawing Sheets

I
CURRENT

THREE DIMENSIONAL WIRING INDUCTANCE CALCULATION SYSTEM

BACKGROUND OF THE INVENTION

1. Field of the Invention

The present invention relates to a method for deriving a parasitic parameter of a wiring. More specifically, the invention relates to a method for calculating an inductance of a three-dimensional wiring for calculating a self inductance and a mutual inductance of a wiring in a large scale integrated circuit (LSI) or so forth.

2. Description of the Related Art

When a configuration of wiring and a relative arrangement of wirings are determined, it is required to accurately derive parasitic parameters, such as a resistance, a capacitance, an inductance and so forth through arithmetic operation without performing actual measurement. For instance, in recent years, speeding of the LSIs and complication of the wiring structure within the LSIs are progressing. Associated with this, signal delay, fluctuation of power source voltage, generation of signal noise and so forth due to inductance component in the wiring structure becomes significant.

Therefore, in designing of an LSI, it is becoming necessary to accurately estimate the parasitic parameter of the wiring to increase process steps in estimating of the parasitic parameter in the designing operation. Similarly, it is also required to arithmetically derive the parasitic parameter with respect to the lead portion of the package of the LSI, and the wiring on a printed circuit board or wiring in a transition for microwave or integration circuit. When the inductance of the wiring is derived through arithmetic operation, the inductance is expressed as a sum or difference of coefficients having substantially the same size to a self inductance of individual wiring and a mutual inductance with respect to several adjacent wirings. Therefore, it is required to precisely perform calculation for respective of inductances. Also, it is required to perform calculation at high speed.

In order to satisfy such demands, it becomes necessary to accurately calculate the inductance on the basis of a basic equation. The accurate basic equation of the inductance can be expressed as follow, as recited in C. Hoer et al., Journal of Research of NBS, 1965, Vol. 69C, page 127 (which publication will be hereinafter referred to as publication 1).

Namely, an inductance $L_{12}$ is expressed by a volume integrating equation of a local electromagnetic energy per unit current with a current density vector $J(X_j)$ at a coordinate $x_j$ of the wiring 2 and a vector potential $A_1(x_j)$ at the coordinate $x_j$ generated by the current of the wiring 1.

$$L_{1,2} = \frac{1}{I_1 I_2} \int A_1(x_j) \cdot J(X_j) dv_j \tag{1}$$

Here, $I_1$, and $I_2$ are current values respectively flowing in wirings 1 and 2, and $dv_j$ is a volume factor of the wiring 1. Also, $A_1(x_j)$ is a vector potential expressed by:

$$A_1(x_j) = \mu/4\pi \int \frac{J(x_j) dv_j}{|x_1 - x_j|} \tag{2}$$

Accordingly, the inductance $L_{1,2}$ is derived from sextuple integration as expressed in the following equation, since double integration of the volume factor is to be performed from the foregoing equations (1) and (2).

$$L_{1,2} = \frac{1}{I_1 I_2} \frac{\mu}{4\pi} \iint \frac{J(x_i) \cdot J(x_j) dv_i dv_j}{|x_i - x_j|} \tag{3}$$

In the special occasion where the uniform current flows in the straight wire with a rectangular cross section, the equation (3) may be analytically derived by employing a sum of complicated trigonometric functions and exponential functions.

However, when the wiring is bent or when the wiring configuration includes an oblique portion, the current within the wiring becomes non-uniform and thus, calculation of a current density vector becomes necessary.

For calculation of the current density vector, an Ohm's law expressed in the following equation (4), in which the current density vector is expressed by a conductivity and an electric field vector is assumed.

$$J=\rho(-\nabla\psi) \tag{4}$$

Then, in the continuous equation of the current density vector, assuming a quasi-static condition in which a charge density vector is held unchanged in the elapsed time, Poisson's equation as in the following equation (5) can be derived. Here, $\rho$ is a conductivity and $\psi$ is an electric potential.

$$\nabla \cdot (\rho \nabla \psi) = 0 \tag{5}$$

Namely, similarly to the case of calculation of capacity, by solving the Poisson's equation, a potential is derived. From the gradient of electric potential, the current density can be derived.

For solving the foregoing equation (5) to derive the current density vector, by dividing the wiring into a several filaments, stepwise approximation may be performed. Namely, there is a method wherein a current distribution is assumed to be uniform in the filament, and the overall inductance coefficient is derived by adding the inductance coefficient by the current density of the respective filaments.

The method wherein a current distribution is assumed to be uniform in the filament, and the overall inductance coefficient is derived by adding the inductance coefficient by the current density of the respective filaments, has been disclosed in P. A. Brennan et al IBM J. Res. Develop., Vol. 23, pp 661 to 668, and known as partial element equipment circuit (PEEC) method. This publication will be hereinafter referred to as publication 2.

However, when an attempt is made to actually divide the wiring into the rectangular parallelepiped elements, and if the wiring is bent, if the configuration of the wiring contains the oblique portion, or if the current path within the wiring is not uniform, a large number of elements becomes necessary for obtaining necessary accuracy. The analytical formula for inductance is complicated one including trigonometric and exponential functions. Therefore, when number of partial element is large, a long CPU time is required only for the analytical calculation of the elements.

Furthermore, as an approximating method for inductance calculation, a filament approximation (linear), a panel approximation (two-dimension) and so forth are present. These approximating methods are basically the PEEC method. In the filament approximation, the current is expressed by a certain line current component. On the other hand, in the panel approximation, the current is expressed by a panel form plain current component. These approximating methods are simplified and advantageous in the viewpoint of calculation speed. However, due to incompleteness of integration of dimension, it is possible to cause overflow of the self inductance in the limit of scaling down of the element.

On the otherhand, as a more flexible method than the PEEC method, there is a method to directly derive the inductance utilizing the equation (1) with solving a differential equation relating to the current density vector and the vector potential.

Namely, initially by solving the Poisson's equation (5) in the wiring, the current density vector is derived. Then, by solving a following vector potential equation (6), which is obtained from a Maxwell's equation, a vector potential A can be obtained for deriving the inductance.

$$\Delta A = -\mu J \qquad (6)$$

Here, $\mu$ is a magnetic permeability for the vacuum.

As a boundary condition for the equation (6), a method is taken to set an analyzing region sufficiently wide, in which the magnetic field is zero at a sufficiently distanced position from the wiring conductor. However, in this method, setting for analyzing region becomes quite difficult. Namely, it causes a problem in precision.

SUMMARY OF THE INVENTION

It is an object of the present invention to provide a three dimensional wiring inductance calculating system capable of improving making discrete error or lack of analyzing precision in calculation of an inductance coefficient of wiring, and thereby shortening CPU time.

According to the first aspect of the invention, a three dimensional wiring inductance calculating system comprises:

wiring structure inputting means for inputting a three dimensional wiring structure of an object for analysis expressed by a three dimensional configuration:

an analyzing space making discrete means for taking the wiring as analyzing space and making discrete the analyzing space into a finite number of partial elements;

current density deriving means for solving a Poisson's equation with respect to an electrical potential in the discretized analyzing space and deriving a current value flowing within the wiring and a current density vector distribution;

boundary condition setting means for solving an integral equation of a vector potential including the current density vector at each of points of partial elements within the wiring by making discrete and deriving the vector potential as a boundary condition at a boundary of the wiring;

vector potential calculating means for deriving the vector potential by solving a vector potential equation in the discretized analyzing space by using the vector potential value at the boundary as the boundary condition; and inductance calculating means for normalizing a product of the obtained vector potential and the current density vector per unit current value, deriving an integral sum of the produce within the analyzing space and calculating an inductance of the wiring.

In the preferred construction, the analyzing space making discrete means divides the analyzing space into quadrangular partial elements. The boundary condition setting means may derive the vector potential on the surface of the wiring as the vector potential at the boundary of wiring.

For obtaining an inductance between a first wiring and a second wiring, the process comprises, in the preferred process:

inputting three dimensional wiring structures of the first wiring and the second wiring by the wiring structure inputting means;

dividing the analyzing space of the first wiring and the second wiring into finite number of partial elements by making discrete by the analyzing space making discrete means;

deriving the current value and the current density vector distribution within the wiring by solving the Poisson's equation with respect to the electric potential in the analyzing space of the first wiring and the second wiring by the current density calculating means;

deriving a vector potential at the node with respect to each node on the surface of one of the wiring by the boundary condition setting means;

solving the vector potential equation in the analyzing space with taking the vector potential at the node as the boundary condition by making discrete by the vector potential calculating means; and deriving the inductance between the first wiring and second wiring from an integral equation of the produces of the vector potential standardized per unit current value and the current density vector by the inductance calculating means.

The boundary condition setting means may derive the vector potential at each node utilizing a distance between the contact point of one of the wiring and a typical pint of the partial element of the other wiring, and the current density vector when the vector potential at each node on the surface of the one of the wiring is calculated. The boundary condition setting means may use a value of a distance function variable depending upon a distance from the contact point to the closest peak of the partial element and the distance from the node to the gravity center of the partial element as a distance from the node of the wiring to the typical point of the partial element when the vector potential at the node of the wiring is calculated.

According to a second aspect of the invention, a three dimensional wiring inductance calculating system comprises:

current density vector calculating means for solving a Poisson's equation with respect to an electric potential in an analyzing space and deriving a distribution of current density vectors flowing within a wiring with taking an analyzing space expressed as three-dimensional configuration as the analyzing space;

boundary condition setting means for calculating a vector operation at a boundary of the wiring as a boundary condition by an integral equation of a vector potential including the current density vector;

vector potential calculating means for deriving the vector potential by solving a vector potential equation in the analyzing space with taking the vector potential as the boundary condition; and inductance calculating means for calculating an inductance of the wiring by performing integration of products of the vector potential obtained from the vector potential equation and the current density vector in the analyzing space.

According to the third aspect of the invention, a method for calculating an inductance of a three dimensional wiring comprises the steps of:

inputting a three dimensional wiring structure of an object for analysis expressed by a three dimensional configuration;

taking the wiring as analyzing space and making discrete the analyzing space into a finite number of partial elements;

solving a Poisson's equation with respect to an electrical potential in the discrete analyzing space and deriving a current value flowing within the wiring and a current density vector distribution;

solving an integral equation of a vector potential including the current density vector at each of points of partial elements within the wiring by making discrete and deriving the vector potential as a boundary condition at a boundary of the wiring;

deriving the vector potential by solving a vector potential equation in the analyzing space by making discrete with taking the vector potential value at the boundary as the boundary condition; and normalizing a product of the obtained vector potential and the current density vector per unit currant value, deriving an integral sum of the produce within the analyzing space and calculating an inductance of the wiring.

According to the fourth aspect of the invention, a three dimensional wiring inductance calculating method comprises the steps of:

solving a Poisson's equation with respect to an electric potential in an analyzing space and deriving a distribution of current density vectors flowing within a wiring with taking an analyzing space expressed as three-dimensional configuration as the analyzing space;

calculating a vector operation at a boundary of the wiring as a boundary condition by an integral equation of a vector potential including the current density vector;

deriving the vector potential by solving a vector potential equation in the analyzing space with taking the vector potential as the boundary condition; and calculating an inductance of the wiring by performing integration of products of the vector potential obtained from the vector potential equation and the current density vector in the analyzing space.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiment of the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

In the present invention, as a boundary condition with respect to the equation (1), a vector potential value is used on the surface of the wiring (boundary of the wiring). Namely, by employing the following integral equation derived from the foregoing equation (6), the vector potential on the surface of the wiring can be obtained.

$$A(x_j) = \mu/4\pi \int \frac{J(x_j)dv_j}{|x_1 - x_j|} \quad (7)$$

According to the present invention, since the value of the vector potential should be defined only at the surface of wiring as the boundary condition, an analyzing space can be limited within the wiring. Thus, the number of divided elements can be reduced. Although CPU time for integration of the equation (1) is required, the overall calculation period can be shortened and a solution with high precision can be obtained.

Figure 1:
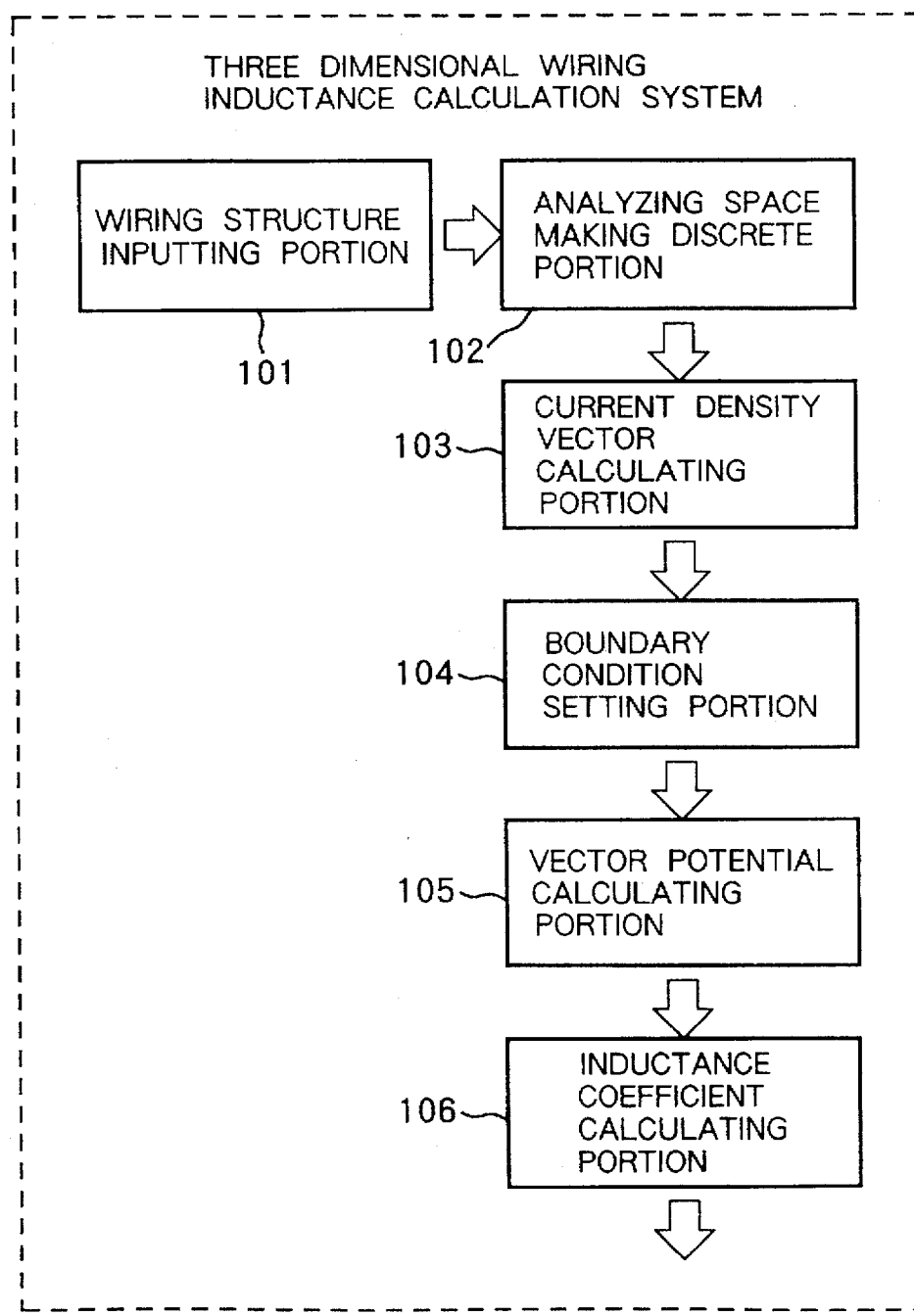
FIG. 1 is a block diagram showing a construction of a three-dimensional wiring inductance calculation system according to the present invention.

FIG. 1 is a block diagram showing a construction of the three dimensional wiring inductance calculating system according to the present invention. The shown embodiment of a three dimensional wiring inductance calculating system is constructed with a wiring structure inputting portion 101, a analyzing space discretizing portion 102, a current density vector calculating portion 103, a boundary condition setting portion 104, a vector potential calculating portion 105 and an inductance coefficient calculating portion 106.

Here, the wiring structure inputting portion 101 performs inputting of a three dimensional configuration of the wiring as an object for wiring inductance calculation. The analyzing space discretizing portion 102 takes a region within the wiring structure as the analyzing space to perform element division for the analyzing space. The current density vector calculating portion 103 derives a distribution of a current value flowing within the wiring and a current density vector.

The boundary condition setting portion 104 sets a boundary condition with respect to a vector potential equation when a current flowing within the wiring structure is given.

A vector potential calculating portion 105 discretizes the vector potential equation by taking the inside of the wiring as the analyzing space for solving, and derives the vector potential for each divided element.

An inductance coefficient calculating portion 106 derives a product of a current density vector and the vector potential per each divided element to standarize the value per unit current value, and derives a sum of the products within the wiring. Thus, an inductance coefficient of a three dimensional wiring is calculated. The inductance coefficient calculating portion 106 outputs the resultant inductance coefficient of the three dimensional wiring.

Figure 2:
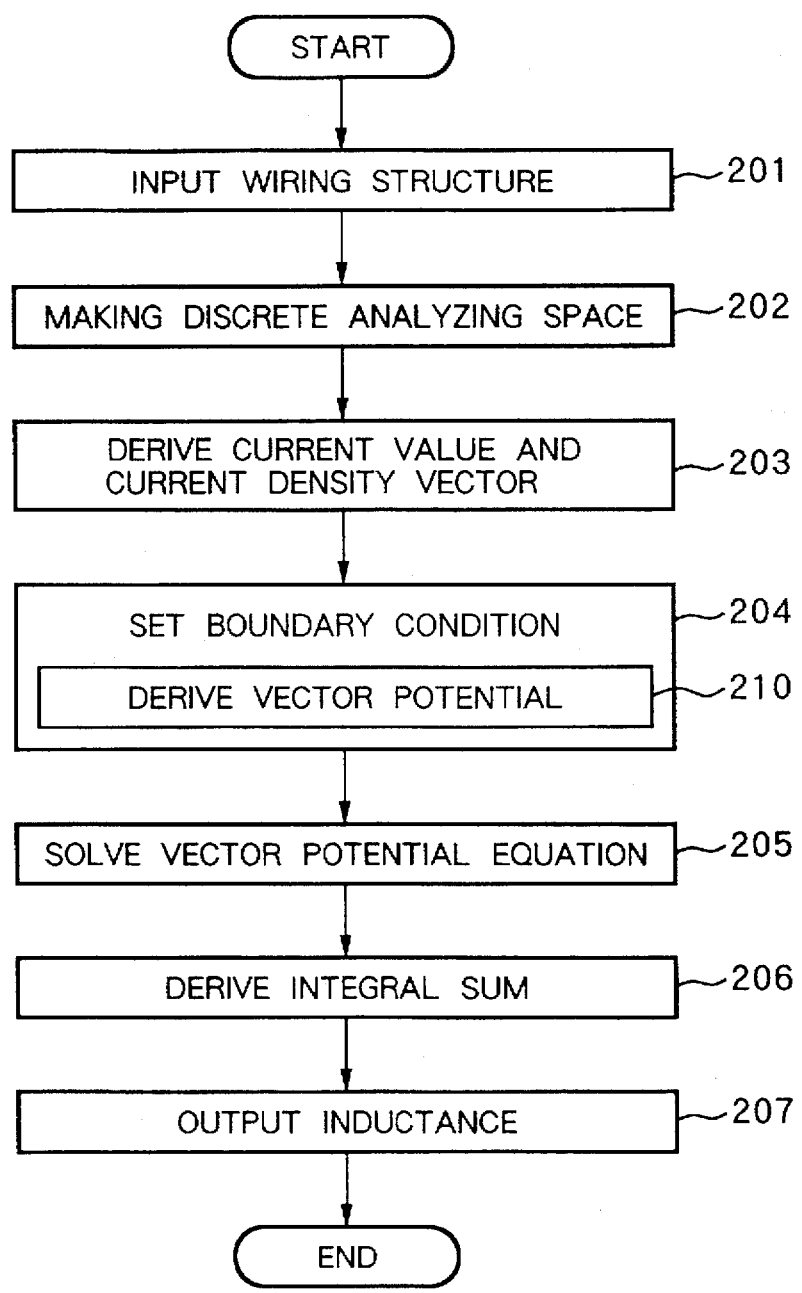
FIG. 2 is a flowchart showing a first arithmetic process procedure to be performed by the three-dimensional wiring inductance calculation system.

FIG. 2 is a flowchart showing a first arithmetic processing procedure in the shown embodiment of the three dimensional wiring inductance calculating system.

At first, the three dimensional configuration of the wiring as an object of the wiring inductance calculation is input (step 201). Here, a wiring structure of an LSI is taken as an object for analysis. For example, an L-shaped aluminum conductor as shown in FIG. 3, or a memory cell wiring structure as shown in FIG. 4, may be the object for analysis.

Figure 3:
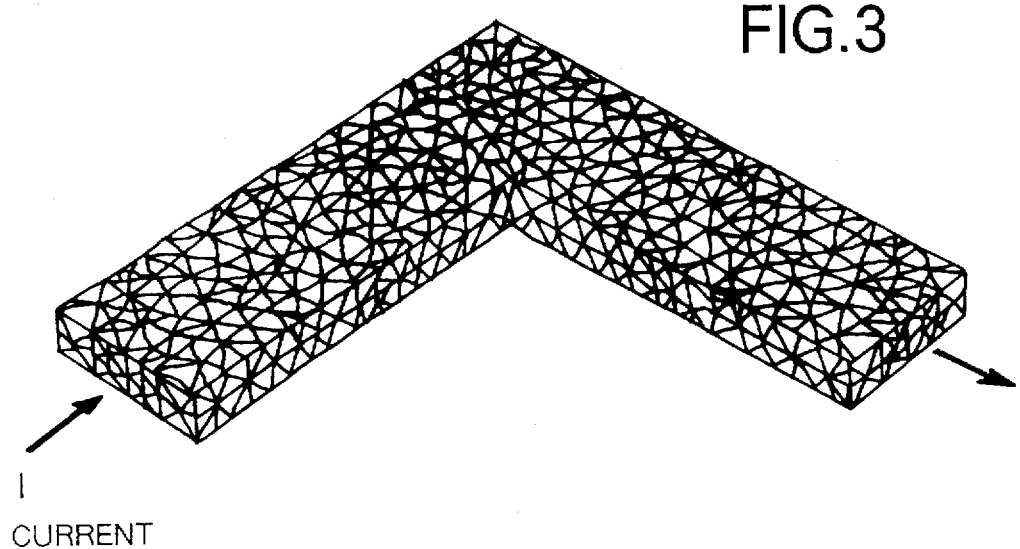
FIG. 3 is an example of divided elements for an L-shaped wiring structure.

FIG. 3 shows the L-shaped wiring conductor. In FIG. 3, it is assumed that the current I flows in a direction as indicated by the arrow. On the other hand, the memory cell wiring structure of FIG. 4 is constructed with gates (word lines) 41, 42 formed on a substrate and extending in one direction, and bit lines 43 to 45 intersecting perpendicularly to the gate line 41, 42 via an insulation layer. The gates 41, 42 and the bit lines 43 to 45 are formed by a conductor, such as aluminum, polycrystalline silicon or so forth, and etching process employing a mask is utilized to obtain a predetermined wiring pattern.

Next, by taking a region within the wiring structure as an analyzing space, element division is performed for the analyzing space (step 202). Namely, analyzing space discretization is performed.

Figure 4:
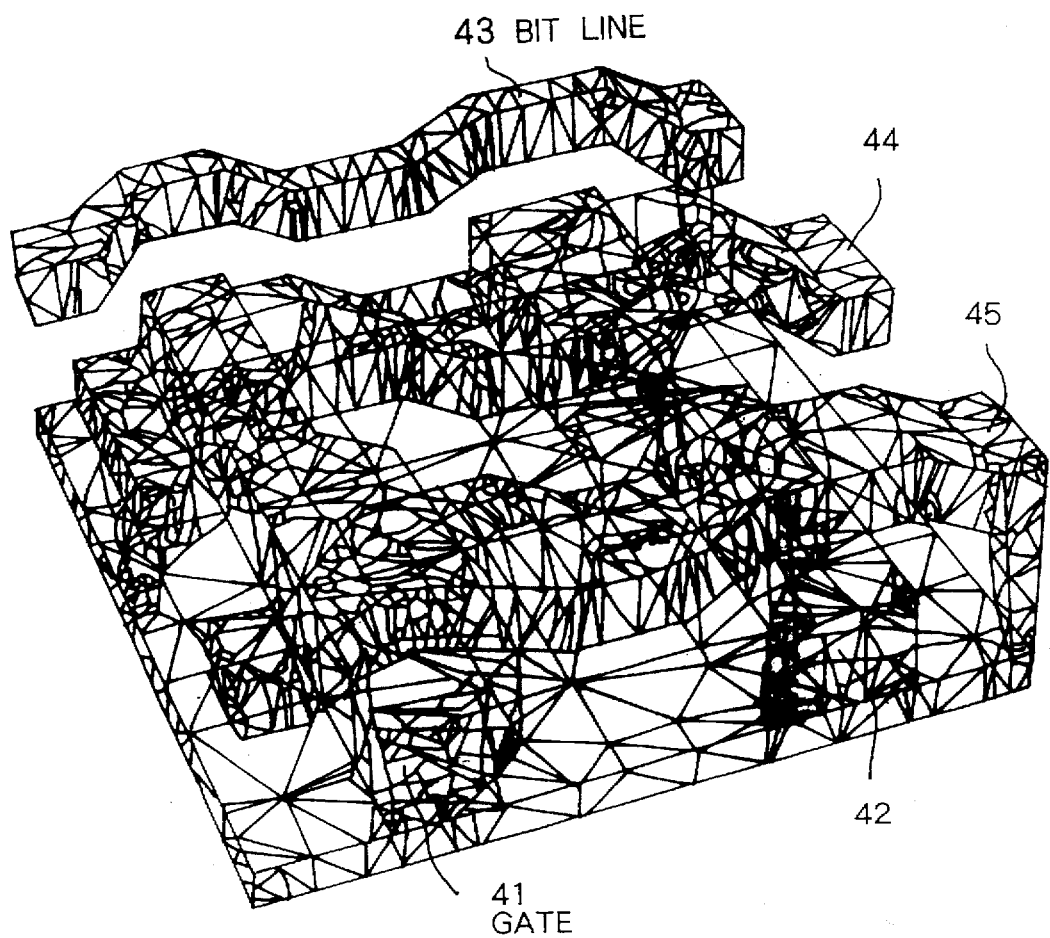
FIG. 4 is an illustration showing an example of divided elements for a memory cell wiring structure.

FIGS. 3 and 4 show examples of element division with respect to the wiring structure. In the drawings, the results of division are shown in wiring surface configuration. For example, as shown in FIG. 3, in case of the L-shaped wiring conductor, the current I flows to be bent obliquely at the L-shaped corner. Here, tetrahedral element division is employed.

Next, in the discrete analyzing space, a electric potential is obtained by solving a Poisson's equation (5) with respect to the electric potential. From the obtained electric potential, a gradient of electric potential is calculated to obtain current value as well as distribution of the current density vector within the wiring (step 203).

Subsequently, when a current flowing within the wiring is given, the boundary condition with respect to the vector potential equation is set (step 204). Namely, in the boundary of wiring on the surface of the wiring, the vector potential value is calculated.

In concrete, terms, by using the previous integral equation (7), namely the integral equation including the current density electric potential at each element position, the vector potential value is calculated (step 210). By using these vector potential values at the boundary of wiring as the boundary condition, the vector potential equation (6) is solved in the discretized analyzing space in the wiring. Thus, the vector potential at each divided element position is obtained (step 205).

Subsequently, at each divided element, the product of the current density vector and the vector potential in the divided element is calculated per unit current, in the numerical integral procedure for the previous equation (1) (step 206). By executing the step 206, the inductance coefficient of the three dimensional wiring is obtained.

Finally, the obtained three dimensional wiring inductance coefficient is outputted (step 207), and the process is terminated.

While the explanation is given for the first arithmetic process according to the present invention, a difference between the embodiment and the conventional method will be discussed.

In the conventional method, with respect to the steps corresponding to the steps 202 to 205, by taking the space including outside of the wiring as an analyzing space, the electric potential and the vector potential are obtained. In the alternative, instead of obtaining the electric potential and the vector potential, the electrical field and the magnetic field are obtained directly in the analyzing space. As the boundary condition in the conventional method, it is frequently employed a condition where the magnetic field at the end of the analyzing space is sufficiently spaced from the wiring. However, in the conventional method, it is required to execute calculation with taking a substantially large region in comparison with wiring per se as an object for analysis. When a distance from the wiring and the end of the analyzing space is made excessively large, pitch of the grids established within the analyzing space for element division becomes too rough, so as to cause lowering of precision. Conversely, the distance to the end of the analyzing region is made excessively small, the boundary condition that the magnetic field is zero cannot be established. Thus, precision is inherently lowered.

With respect to this, in the shown embodiment, in which the analyzing space is only for region for the wiring per se, the vector potential value on the surface of the wiring is obtained by employing the equation (7), and the equation (6) is solved by taking the obtained value as the boundary condition. Thus, the vector potential at the inside of the wiring is obtained.

With the shown embodiment, the element division should be performed within the wiring. Therefore, a number of nodes in the grid required for element division can be significantly reduced in comparison with the conventional method.

As a practical example, in case of the L-shaped wiring conductor shown in FIG. 3, the number of nodes is 1500. Then, the error of the calculated inductance coefficient becomes less than or equal to .1%, and sufficient precision of calculation can be obtained. With respect to this, in the conventional method, the nodal point in such extent, correct value cannot be obtained at all. On the other hand, in the prior art, even when the number of nodes is increased in the extent of 10000 to spend a substantial analyzing period, sufficient precision, in which an error is in the extent of less than or equal to 1%, cannot be obtained.

Figure 5:
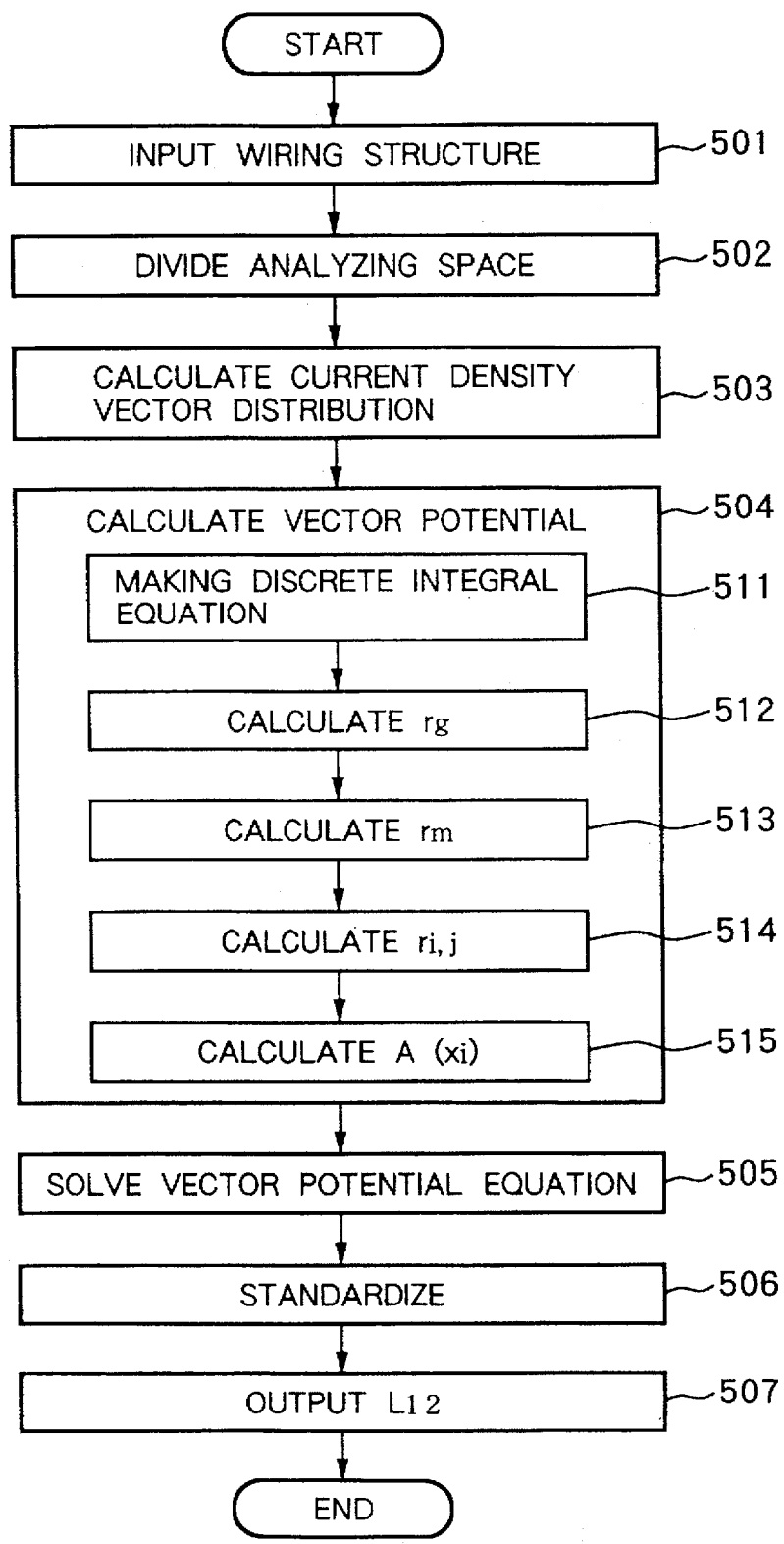
FIG. 5 is a flowchart showing a second calculation process procedure by the three dimensional wiring inductance calculation system.

Next, FIG. 5 is a flowchart showing a second processing procedure by the three dimensional wiring inductance calculating system.

In the second embodiment, the three dimensional wiring inductance coefficient $L_{1,2}$ is obtained between the wiring 1 and 2.

At first, similar to the first arithmetic procedure, the three dimensional configuration is input as taking the region in the wiring 1 and 2 as object for calculation of wiring inductance (step 501). Then, by taking the regions of the wiring 1 and 2 as an analyzing space, the analyzing space is divided into tetrahedral elements (step 502). Then, with respect to the analyzing space for which the element division is performed, Poisson's equation for the electric potential is solved to obtain the electric potential. Then, from the electric potential thus obtained, a gradient of the electric potential is calculated to obtain the current values and the current density vector distributions within the wiring 1 and 2 (step 503).

Subsequently, with respect to each node on the surface of the wiring 1, the vector potential at the relevant node $x_i$ is calculated (step 504). Here, the manner of calculation of the vector potential at the node $x_i$ on the surface of the wiring 1 will be discussed in detail.

At first, the vector potential equation shown in the equation (7) is discretized as in the following equation, (step 511). In the following equation $r_{ij}$ is a distance between the node $x_i$ of the wiring 1 and the typical point of the tetrahedral element j of the wiring 2, and is defined as follows.

$$\int \frac{J(x_i)dv_1}{|x_i - x_j|} \rightarrow \sum_i \frac{J(x_i)\Delta V_i}{r_{i,j}} \quad (8)$$

Next, with respect to each tetrahedral element, a distance $r_g$ from the node $X_i$ of the wiring 1 to the gravity center of the tetrahedral element j is calculated (step 512). Then, a distance $r_m$ from the node $x_i$ to the closest peak of each tetrahedral element j is calculated (step 513). Using these distances $r_g$ and $r_m$, a distance $r_{ij}$ from the node $X_i$ to the typical point of the quadrangular element j is calculated by the following algorithm (step 514).

If $r_m > r_g$

Then $r_{i,j} = r_g$

Else $r_{i,j} = wr_g + (1-w)[r_m + (r_g - r_m)\sin\left(\frac{\pi r_m}{2 r_g}\right)]$ \quad (9)

Here, w is a weight coefficient. When the tetrahedral wiring is taken as the object for analysis, the weight coefficient is preliminarily determined at a reasonable value from a result obtained through comparison of precise solution obtained through division into the tetrahedral elements and the exact solution by the method of the shown embodiment. In the shown embodiment, a value greater than or equal to 0.6 and less than 1 is used as the weight coefficient.

Then, using the distance $r_{ij}$ and the current density vector $j(x_i)$ of the tetrahedral element i, the value of the vector potential at the node on the surface of wiring is calculated through the following equation (step 515).

$$A_1(x_j) = \mu/4\pi \sum_i \frac{J(x_i)\Delta v_i}{r_{ij}} \quad (10)$$

As set forth above, once the vector potential value at the node on the surface of the wiring is obtained, the overall vector potential of the inside of the wiring is calculated by a discretizing method of the foregoing equation (6) (step 505). Then, from an integral equation (1) of the product of the vector potential normalized per unit current value and the current density vector, the three dimensional inductance coefficient $L_{1,2}$ can be obtained (step 506). Finally, the process is terminated after outputting the three dimensional inductance coefficient $L_{12}$ of the wirings 1 and 2 thus obtained.

In the foregoing second arithmetic process, even when the structures of the wirings 1 and 2 are the same, the three dimensional inductance coefficient $L_{1,2}$ can be obtained accurately. On the other hand, in the foregoing calculation, even for the relationship between the wirings 1 and 2, the three dimensional wiring inductance coefficient can be similarly obtained.

Figure 6:
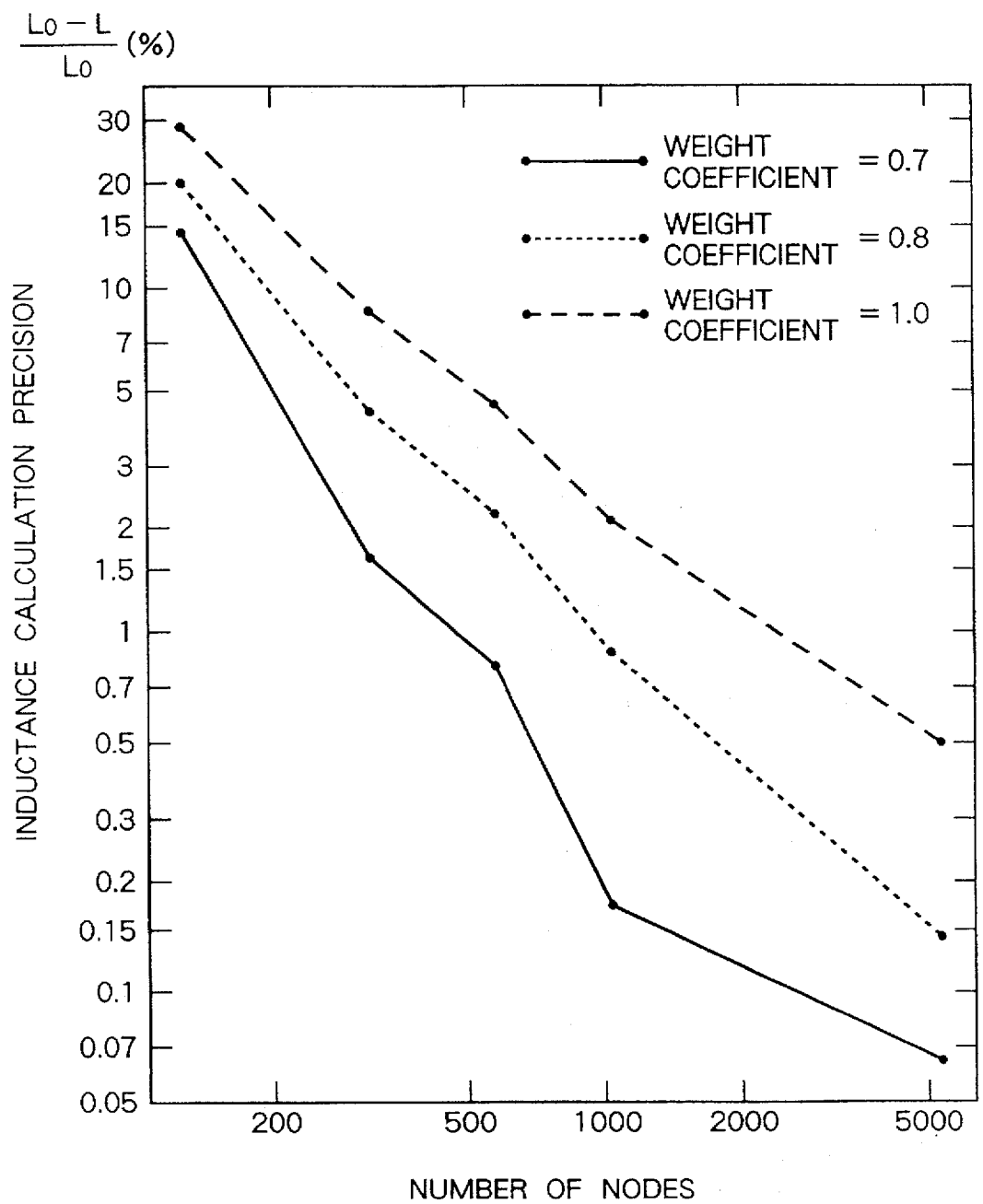
FIG. 6 is a graph showing relationship between calculation error and number of nodes in the shown embodiment, illustrated per different weighting coefficient value, with taking the L-shaped conductor as an object for calculation.

FIG. 6 is a graph showing a relationship between a calculation error of the inductance in the shown embodiment and the number of nodes per each weight coefficient value, by taking the L-shaped conductor shown in FIG. 3 as the object for calculation. In the graph, the vertical axis represents an error from a numerically exact value $L_o$ of the calculated value L of the inductance, and the horizontal axis represents number of nodes in element division.

In the shown embodiment, the calculation error of the inductance is primarily caused by an error in discretizing of the foregoing equation (8). Therefore, by increasing of the number of nodes, the calculation error can be reduced.

It should be noted that the similar method for discretizing of the integral equation of the vector potential shown in FIG. 6, is the method for calculation of an electrostatic capacity. Such method has been disclosed in K. Nabors et al., IEEE Transactions on Microwave Theory and Techniques, Vol. 40, pp 1496 to 1506, 1992. This publication will be referred hereinafter as the publication 3. In the method disclosed in the publication 3, in the surface integration of a solid body, the integrating region is divided into a plurality of panel elements, contribution of each panel element is then calculated by expressing with multipole development at respective center points of respective panel elements. Thus, the electrostatic potential for calculating the capacitance of the wiring is obtained. In concrete terms, in the method disclosed in the publication 3, when a diameter of the range where the elements are present is less than or equal to a distance r to the center of the element, multipole development cannot be performed (the contribution of the element is represented only by the distance r as first approximation). Otherwise, the divided element is further divided.

In contrast to this, in the shown embodiment, the contribution of each element is calculated in consideration of not only the simple distance to the center of the element, but also the distance $r_m$ to the closest contact point of the element, and further depending on a ratio $r_m/r_g$ of the distance $r_g$ to the gravity center of the element and the distance $r_m$ to the closest contact point.

The present invention is directed to calculation of the inductance and the publication 3 is directed to calculation of the electrostatic capacity. Therefore, it is not possible to simply compare both. However, when attempt is made to improve precision in the method of the publication 3, the number of divided elements is abruptly increased to require significantly long CPU time. In contrast to this, in the method of the present invention, precise calculation can be performed with lesser number of divided elements.

In FIG. 6, the case where the weight coefficient value is 1, corresponds to the simple approximation in the publication 3 (considering only distance r). In the present invention, by setting the weight value less than 1, and more typically to 0.7 to 0.8, the distance $r_m$ to the closest contact point can be reflected in the contribution as calculated. As a result, by setting the number of dividing contact points in the order of 1000, the precision in calculation can become less than or equal to 1%. Therefore, remarkable improvement of the precision in calculation can be achieved. In general, the calculation period of the inductance is increased to be proportional to 1.5 power or square of the number of nodes n. Therefore, in order to achieve the precision of 1%, the number of nodes in the order of 4000 is required in the conventional method. In contrast, the present invention can achieve such precision by merely about 1000 of nodes. As a result, the required calculation period becomes approximately one tenth in comparison with the conventional method.

On the other hand, even for the memory cell wiring structure including the oblique pattern as shown in FIG. 4, the shown embodiment may obtain the inductance coefficient at lesser number of nodes (about 5000 to 6000) in comparison with the conventional method.

While the present invention has been discussed in terms of the shown embodiment, the process may be applicable for integral calculation of the electrostatic potential. Then, even with respect to calculation of capacitance of the wiring, the present invention may contribute for shortening the CPU time.

As set forth above, the present invention is effective to make it possible to derive the inductance value with high precision in a short CPU time by deriving the vector potential value at the surface of the wiring, by taking the vector potential value as the boundary condition, and by deriving the vector potential within the wiring. Thus, the analyzing space can be limited to only to the inside of the analyzing space. Therefore, the inductance value can be derived at high speed with high precision.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above, but to include all possible embodiments which can be embodied within a scope encompassed and equivalents thereof with respect to the features set out in the appended claims.

What is claimed is:

1. A three dimensional wiring inductance calculating system, comprising:

wiring structure inputting means for inputting a three dimensional wiring structure of an object for analysis expressed by a three dimensional configuration;

an analyzing space partitioning means for taking the wiring structure as an analyzing space and partitioning the analyzing space into a finite number of partial elements;

current density deriving means for solving a Poisson's equation with respect to an electrical potential in the partitioned analyzing space and deriving a plurality of current values and a plurality of current density vectors within the partitioned analyzing space;

boundary condition setting means for solving an integral equation of a vector potential including the corresponding current density vector at each of points of partial elements within the partitioned analyzing space by deriving the vector potential as a boundary condition at a boundary of the partitioned analyzing space;

vector potential calculating means for deriving a value for the vector potential by solving a vector potential equation in the partitioned analyzing space and taking the vector potential value at the boundary as the boundary condition; and inductance calculating means for normalizing a product of the vector potential value and said current density vector per unit current value, deriving an integral sum of said product within the partitioned analyzing spaces, and calculating an inductance of said wiring structure as a result thereof.

2. A three dimensional wiring inductance calculating system as set forth in claim 1, wherein said boundary condition setting means derives the vector potential on the partitioned analyzing space which corresponds to a surface of said wiring structure as the vector potential at the boundary of the partitioned analyzing space.

3. A three dimensional wiring inductance calculating system as set forth in claim 2, wherein the partitioned analyzing space corresponds only to the surface of the wiring structure, and does not correspond to any regions exterior to the wiring structure.

4. A three dimensional wiring inductance calculating system as set forth in claim 1, wherein, for obtaining an inductance between a first wiring and a second wiring, wherein three dimensional wiring structures of said first wiring and said second wiring are inputted by said wiring structure inputting means, wherein said analyzing space partitioning means includes dividing means for dividing an analyzing space corresponding to said first wiring and said second wiring into a finite number of partial elements, wherein said current density deriving means includes first deriving means for deriving a current value flowing along a plurality of current density vectors within the partitioned analyzing space by solving the Poisson's equation with respect to an electric potential in the partitioned analyzing space of the first wiring and the second wiring, wherein said boundary condition setting means includes second deriving means for deriving a vector potential with respect to each node in the partitioned analyzing space which corresponds to a node on a surface of one of said first wiring and said second wiring, wherein said vector potential calculating means includes solving means for solving a vector potential equation in the partitioned analyzing space by taking the vector potential at said each node as the boundary condition, and wherein said inductance calculating mean includes third deriving means for deriving the inductance between said first wiring and said second wiring from an integral equation of the products of the vector potential standardized per unit current value and said current density vector.

5. A three dimensional wiring inductance calculating system as set forth in claim 4, wherein said boundary condition setting means derives the vector potential at said each node by utilizing a distance between a contact point of one of the first wiring and the second wiring and a typical point of one of the partial elements of the other of the first wiring and the second wiring 6. A three dimensional wiring inductance calculating system as set forth in claim 5, wherein, for calculating the vector potential at said each node, said boundary condition setting means uses a value of a distance function that varies depending upon a distance from the contact point to a closest peak of the one partial element and a distance from said each node to a gravity center of the one partial element, as a distance from said each node to the typical point of the one partial element 7. A three dimensional wiring inductance calculating system as set forth in claim 5, wherein a weighting value between 0 and 1 is used in determining the distance between the contact point and the typical point, so as to affect a contribution factor in the calculating of the inductance of the wiring structure.

8. A three dimensional wiring inductance calculating system as set forth in claim 1, wherein said analyzing space partitioning means divides the analyzing space into tetrahedral partial elements.

9. A three dimensional wiring inductance calculating system, comprising:

current density vector calculating means for solving a Poisson's equation with respect to an electric potential in an analyzing space and deriving a plurality of current density vectors flowing within a wiring, wherein the analyzing space corresponds to a three-dimensional configuration of said wiring;

boundary condition setting means for calculating a vector operation at a boundary of the analyzing space as a boundary condition by an integral equation of a vector potential including said current density vectors;

vector potential calculating means for deriving the vector potential by solving a vector potential equation by taking said vector potential as the boundary condition in the analyzing space; and inductance calculating means for calculating, in the analyzing space, an inductance of said wiring by performing integration of products of the vector potential obtained from said vector potential equation and said current density vectors.

10. A method for calculating an inductance of a three dimensional wiring, the method comprising the steps of:

a) inputting a three dimensional wiring structure of an object for analysis expressed by a three dimensional configuration;

b) taking the wiring structure as an analyzing space and partitioning the analyzing space into a finite number of partial elements;

c) solving a Poisson's equation with respect to an electrical potential in the partitioned analyzing space, and deriving a current value for the partitioned analyzing space and a plurality of current density vectors;

d) solving an integral equation of a vector potential including the corresponding current density vector at each node of the partial elements within the partitioned analyzing space which corresponds to a node of a surface of the wiring structure by deriving the vector potential as a boundary condition at a boundary of said partitioned analyzing space;

e) deriving a value of the vector potential by solving a vector potential equation in said partitioned analyzing space by taking the vector potential value at the boundary as the boundary condition; and f) standardizing a product of the derived vector potential and said current density vector per unit current value, deriving an integral sum of said product within the partitioned analyzing space, and calculating an inductance of said wiring structure as a result there.

11. A three dimensional wiring inductance calculating method as set forth in claim 10, wherein, for obtaining an inductance between a first wiring and a second wiring, the method further comprising the steps of:

g) inputting three dimensional wiring structures of said first wiring and said second wiring h) partitioning the analyzing space of said first wiring and said second wiring into a finite number of partial elements;

i) deriving, using the partitioned analyzing space, a current value flowing within said wiring structure and the plurality of current density vectors by solving the Poisson's equation with respect to an electric potential in the partitioned analyzing space of said first wiring and said second wiring;

j) deriving a vector potential with respect to each node in the partitioned analyzing space which corresponds to a node of a surface of one of said first wiring and said second wiring;

k) solving the vector potential equation in the partitioned analyzing space of said first wiring and said second wiring by taking the vector potential at said each node as the boundary condition; and l) deriving the inductance between said first wiring and said second wiring from an integral equation of the products of the vector potential standardized per unit current value and said current density vector.

12. A three dimensional wiring inductance calculating method as set forth in claim 11, wherein the vector potential is derived at said each node by utilizing a distance between a contact point of one of said first wiring and said second wiring and a typical point of one of the partial elements of the other of said first wiring and said second wiring.

13. A three dimensional wiring inductance calculating method as set forth in claim 12, wherein, for calculating the vector potential at said each node, a value of a distance function that varies depending upon a distance from the contact point to a closest peak of the one partial element and a distance from said each node to a gravity center of the one partial element, is used as a distance from said each node to the typical point of said one partial element.

14. A three dimensional wiring inductance calculating method as set forth in claim 12, wherein a weighting value between 0 and 1 is used in determining the distance between the contact point and the typical point, so as to affect a contribution factor in the calculating of the inductance of the wiring structure.

15. A three dimensional wiring inductance calculating method as set forth in claim 10, wherein step b) includes partitioning the analyzing space into quadrangular partial elements.

16. A three dimensional wiring inductance calculating method as set forth in claim 10, wherein the vector potential on the partitioned analyzing space which corresponds to a surface of said wiring structure is derived as the vector potential at the boundary of the partitioned analyzing space.

17. A three dimensional wiring inductance calculating method as set forth in claim 16, wherein the partitioned analyzing space corresponds only to the surface of the wiring structure, and does not correspond to any regions exterior to the wiring structure.

18. A three dimensional wiring inductance calculating method, comprising the steps of:

a) solving a Poisson's equation with respect to an electric potential in an analyzing space and deriving a plurality of current density vectors in the analyzing space to represent current flowing within a wiring, wherein the analyzing space corresponds to a three-dimensional configuration of said wiring;

b) calculating a vector operation at a boundary of said analyzing space as a boundary condition by an integral equation of a vector potential including said current density vectors;

c) deriving the vector potential by solving a vector potential equation by taking said vector potential as the boundary condition in said analyzing space; and d) calculating, in said analyzing space, an inductance of said wiring by performing integration of products of the vector potential obtained from said vector potential equation and said current density vectors.

* * * * *